US011968765B2

(12) United States Patent
Kopiness et al.

(10) Patent No.: US 11,968,765 B2
(45) Date of Patent: Apr. 23, 2024

(54) INDUCTION COOKING SYSTEM (71) Applicants: The Vollrath Company, L.L.C., Sheboygan, WI (US); Virginia Tech Intellectual Properties, Inc., Blacksburg, VA (US)

(72) Inventors: Jeremiah Kopiness, Saukville, WI (US); Andrew Amrhein, Sheboygan, WI (US); Jong-Woo Kim, Blacksburg, VA (US); Moonhyun Lee, Blacksburg, VA (US); Jih-Sheng Lai, Blacksburg, VA (US)

(73) Assignees: The Vollrath Company, L.L.C., Sheboygan, WI (US); Virginia Tech Intellectual Properties, Inc., Blacksburg, VA (US)

( * ) Notice: Subject to any disclaimer, the term of this patent is extended or adjusted under 35 U.S.C. 154(b) by 245 days.

(21) Appl. No.: 16/657,472

(22) Filed: Oct. 18, 2019

(65) Prior Publication Data
US 2020/0281048 A1  Sep. 3, 2020

Related U.S. Application Data (60) Provisional application No. 62/812,894, filed on Mar. 1, 2019.

(51) Int. Cl.
*H05B 6/06* (2006.01)
*H02M 1/00* (2006.01)
(Continued)

(52) U.S. Cl.
CPC .......... *H05B 6/062* (2013.01); *H02M 1/0009* (2021.05); *H02M 7/53871* (2013.01);
(Continued)

(58) Field of Classification Search
CPC ... H05B 6/062; H05B 6/1209; H02M 1/0009; H02M 7/53871; H02M 7/4815; H03L 5/00; Y02B 70/10
See application file for complete search history.

(56) References Cited

U.S. PATENT DOCUMENTS 6,727,482 B2 *  4/2004  Bassill ..................... H05B 6/04
                                                      219/625
8,618,747 B2 * 12/2013  Park ........................... G05F 1/70
                                                      315/307

(Continued)

FOREIGN PATENT DOCUMENTS

EP     3331321 A1 *  6/2018  ............ H05B 6/062
JP  2019106830 A  *  6/2019

OTHER PUBLICATIONS

Texas Instruments website for TMS 320F28075 (Year: 2017).*
(Continued)

*Primary Examiner* — John J Norton
(74) *Attorney, Agent, or Firm* — Foley & Lardner LLP (57) ABSTRACT The present disclosure describes devices and methods for improving the power efficiency and control of an induction heating system. In particular, the induction heating system includes a series resonant bridge inverter circuit and a control circuit. The inverter circuit includes one or more induction coils that are structured to inductively couple to the cookware to heat the cookware and a current sensor structured to sense a coil current signal across the one or more inductor coils. In particular, the current sensor is structured to generate a positive sensed voltage signal corresponding to a positive portion of the coil current signal and
(Continued)

a negative sensed voltage signal corresponding to a negative portion of the coil current. The control signal is structured to control switching of a first and a second set of switches based on the positive and negative sensed voltage signals.

11 Claims, 5 Drawing Sheets

(51) Int. Cl.
    *H02M 7/48*     (2007.01)
    *H02M 7/5387*     (2007.01)
    *H03L 5/00*     (2006.01)
    *H05B 6/12*     (2006.01)

(52) U.S. Cl.
    CPC .............. *H03L 5/00* (2013.01); *H05B 6/1209* (2013.01); *H02M 7/4815* (2021.05); *Y02B 70/10* (2013.01)

(56) References Cited

U.S. PATENT DOCUMENTS

| | | | |
|---|---|---|---|
| 9,844,099 B2 * | 12/2017 | Yun .......................... | H05B 6/04 |
| 10,973,091 B2 * | 4/2021 | Son ......................... | F24C 7/083 |
| 2015/0009732 A1 * | 1/2015 | Turki ................. | H02M 7/53871 |
| | | | 363/97 |

OTHER PUBLICATIONS

Circuitous website (Year: 2018).*
https://www.electronics-tutorials.ws/accircuits/sinusoidal-waveform.html (Year: 2017).*
Electronics-tutorials.ws/opamp/op-amp-comparator.html, 2017 (Year: 2017).*
EP 3331321 A1 (Year: 2018).*
Kim, et al., "A New Control Method for Series Resonant Inverter with Inherently Phase-Locked Coil Current with Induction Cookware Applications," IEEE, 2018, pp. 3517-3522.

* cited by examiner

INDUCTION COOKING SYSTEM

CROSS REFERENCE TO RELATED APPLICATION

This application claims priority to U.S. Provisional Patent Application No. 62/812,894 entitled "Induction Cooking System," filed Mar. 1, 2019, the contents of which are incorporated by reference herein.

BACKGROUND

Induction cooking systems are becoming more prevalent in modern day use. Particularly, homeowners and business owners are attracted to induction cooking systems due to their ability for fast and efficient heating as compared to alternative cooking systems. In general, induction cooking systems utilize an alternating current through an induction coil to produce a varying magnetic field that induces current flow in a conductive target (e.g., pan or pot). The induced current flow (e.g., eddy currents) causes the target to heat. However, to control the heating temperature of the target the alternating current needs to be controlled. Yet, controlling the alternating current in an induction circuit (e.g., a RLC circuit) is difficult due to fundamental physics unique to those types of circuits. Moreover, problems of decreased efficiency are exacerbated at low power settings, particularly where the time that a voltage is applied to the inverter circuit is much less than the period of the resonant frequency of the induction cooking system.

SUMMARY

Various embodiments disclosed herein are related to a circuit for inductively heating cookware. In some embodiments, the circuit includes a series resonant inverter circuit and a control circuit. The series resonant inverter circuit may include a plurality of switches and one or more induction coils that are structured to inductively couple to the cookware to heat the cookware. The inverter circuit may also include a current sensor that is configured to sense a coil current signal across the one or more of the induction coils and generate a first sensed voltage signal that corresponds to one of a positive portion or a negative portion of the coil current signal a second sensed voltage signal that corresponds to the other of the positive portion of the negative portion of the coil current signal. The control circuit is configured to control switching of a first set of one or more of the plurality of switches based on the first sensed voltage signal and a second set of one or more of the plurality of switches based on the second sensed voltage signal.

In some embodiments, the control circuit is configured to compare a magnitude of the first sensed voltage signal to a threshold voltage and control switching of the first set of switches responsive to determining the magnitude of the first sensed voltage signal is equal to the threshold voltage. The control circuit is further configured to compare a magnitude of the second sensed voltage signal to the threshold voltage and control switching of the second set of switches responsive to determining the magnitude of the second sensed voltage signal is equal to the threshold voltage.

In some embodiments, the control circuit includes a first comparator and a second comparator. The first comparator is configured to compare the magnitude of the first sensed voltage signal to the threshold voltage and generate a first output responsive to determining the magnitude of the first sensed voltage signal is equal to the threshold voltage. Further, the second comparator is configured to compare the magnitude of the second sensed voltage signal to the threshold voltage and generate a second output in response to determining the magnitude of the second sensed voltage signal is equal to the threshold voltage.

In some embodiments, the first comparator is configured to generate the first output to have a rising edge responsive to determining if the magnitude of the first sensed voltage signal is equal to the threshold voltage. Similarly, the second comparator is configured to generate the second output to have a rising edge responsive to determining if the magnitude of the second sensed voltage signal is equal to the threshold voltage. The control circuit may further comprise a first rising edge detector configured to detect the rising edge of the first output of the first comparator. The control circuit may be configured to control switching of the first set of switches based on an output of the first rising edge detector. The control circuit may further comprise a second rising edge detector configured to detect the rising edge of the second output of the second comparator. The control circuit may be configured to control switching of the second set of switches based on an output of the second rising edge detector.

In some embodiments, the control circuit may also include a first control signal generator and a second control signal generator. The first control signal generator may generate a first set of one or more control signals configured to control the switching of the first set of switches based on the output of the first rising edge detector. The second control signal generator may generate a second set of one or more control signals configured to control the switching of the second set of switches based on the output of the second rising edge detector. In some embodiments, the control circuit is configured to transmit the first set of control signals to the first set of switches and the second set of control signals to the second set of switches. In some embodiments, the first set of control signals and the second set of control signals are pulse width modulation (PWM) signals.

In some embodiments, the control circuit is configured to control the switching of the plurality of switches based on comparison of the magnitude of the first sensed voltage signal and the second sensed voltage signal to the threshold voltage without controlling switching of the plurality of switches by monitoring a phase of the coil current signal. In some embodiments, the control circuit is configured to calculate the threshold voltage such that the control circuit causes activation of one or more switches of the plurality of switches at a time when magnitudes of the coil current signal, the first sensed voltage signal, and the second sensed voltage signal are substantially zero. In some embodiments, the inverter circuit may also include a capacitor connected in series with the one or more induction coils, where the first set of switches is coupled to the one or more induction coils and the second set of switches is coupled to the capacitor.

Another implementation of the present disclosure is a method for controlling a circuit for inductively heating cookware. The circuit may include a series resonant inverter circuit comprising a plurality of switches and one or more induction coils structured to inductively couple to the cookware to heat the cookware. In a first operation, the current sensor senses a coil current signal across the one or more induction coils. In a second operation, a first sensed voltage signal that corresponds to one of a positive portion or a negative portion of the coil current signal is generated. In a third operation a second sensed voltage signal that corresponds to the other of a positive portion of the negative portion of the coil current signal is generated. In a fourth operation, a first set of one or more of the plurality of switches based on the first sensed voltage signal are controlled. In a fifth operation, a second set of one or more of the plurality of switches based on the second sensed voltage signal are controlled.

In some embodiments, controlling the switching of the first set of switches includes comparing a magnitude of the first sensed voltage signal to a threshold voltage and controlling switching of the first set of switches in response to determining the magnitude of the first sensed voltage signal is equal to the threshold voltage. Further, controlling the switching of the second set of switches may include comparing a magnitude of the second sensed voltage signal to a threshold voltage and controlling switching of the second set of switches in response to determining the magnitude of the second sensed voltage signal is equal to the threshold voltage.

In some embodiments, the first set of switches include a first switch and a second switch in series with the first switch coupled to a positive terminal of a direct current (DC) bus (e.g., DC voltage source) and the second switch coupled a negative terminal of the DC bus. Additionally, the second set of switches may include a third switch and a fourth switch in series with the third switch coupled to the input voltage line and the fourth switch coupled to ground, a first junction between the first switch and the second switch coupled to a first terminal of a series resonant circuit portion of the inverter circuit comprising the one or more induction coils and a second junction between the third switch and the fourth switch coupled to a second terminal of the series resonant circuit portion. In some embodiments, controlling the switching of the plurality of switches includes activating the first switch and the fourth switch. Controlling the switching of the plurality of switches may further include deactivating the first switch and activating the second switch. Controlling the switching of the plurality of switches may further include detecting that the second sensed voltage signal is equal to a threshold voltage and, in response, deactivating the fourth switch and activating the third switch. Controlling the switching of the plurality of switches may further include deactivating the third switch and activating the fourth switch. Controlling the switching of the plurality of switches may further include detecting that the first sensed voltage signal is equal to the threshold voltage and, in response, deactivating the second switch and activating the first switch.

In some embodiments, the method further includes calculating the threshold voltage such that the activation of the third switch and the first switch occur at a time when magnitudes of the coil current signal, the first sensed voltage signal, and the second sensed voltage signal are near zero. In some embodiments, the threshold voltage corresponds to a threshold current of the coil current. In some embodiments, the threshold current is calculated based on the power setting. Further, the method may include deactivating the first switch and activating the second switch is done after a calculated amount of time.

In some embodiments, the calculated amount of time is an amount of time that a voltage is applied to the series resonant portion based on a power setting received from an internal or external control signal or parameter, dictates a duty cycle of power output of the series resonant portion.

Another implementation of the present disclosure is a circuit for inductively heating cookware. The circuit includes a series resonant inverter circuit. The inverter circuit includes a plurality of switches and one or more induction coils structured to inductively couple to the cookware to heat the cookware. The inverter circuit further includes a voltage sensor configured to sense a voltage across at least one of the plurality of switches and a control circuit configured to control switching of a first set of one or more of the plurality of switches based the voltage sensed across the at least one of the plurality of switches.

In some embodiments, the control circuit is configured to compare a magnitude of the voltage sensed to a threshold voltage and control switching of a set of the plurality of switches. In some embodiments, the threshold voltage is a value near zero.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes devices and methods for improving the efficiency of an induction cooking system. In particular, devices and methods are described for decreasing the power losses of an induction cooking system during operation. In one aspect, a series resonant bridge inverter circuit (i.e., series circuit) includes an induction coil and a current detector connected in series. In some embodiments, the inverter circuit also includes a capacitor wired in series. The current detector provides real time feedback of the current in the inverter circuit and allows for a control circuit to calculate precise times to control a voltage applied to the inverter circuit. The control circuit (i.e., control circuit) may control one or more switches connected to the inverter circuit in order to control the voltage that is applied to the inverter circuit. In some embodiments, the current detector provides the control circuit with a sensed current and allows the transistors to be turned on and off at optimal times that reduce large turn off and on losses. That is, by optimizing the timing of the controls based off the sensed current, the induction cooking system can control the amount of time that the voltage is applied to the inverter circuit with switching characteristics that greatly reduce power inefficiencies. For example, the described devices and methods allow for the transistors to turn on and off when the current in particular parts of the system allow for zero voltage switching and/or zero current switching. Thus, losses that are inherent to switches (e.g., transistors) at high frequencies are reduced. Further, the reduced amount of components needed in the described embodiments allow for a small footprint while also improving the efficiency.

Figure 1A:
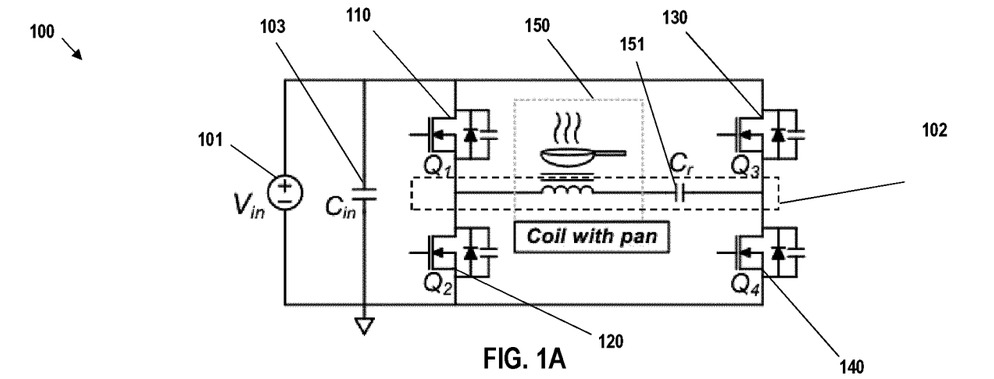
FIGS. 1A and 1B are schematic drawings of an induction cooking circuit of an induction cooking system in accordance with an illustrative embodiment.
Figure 1B:
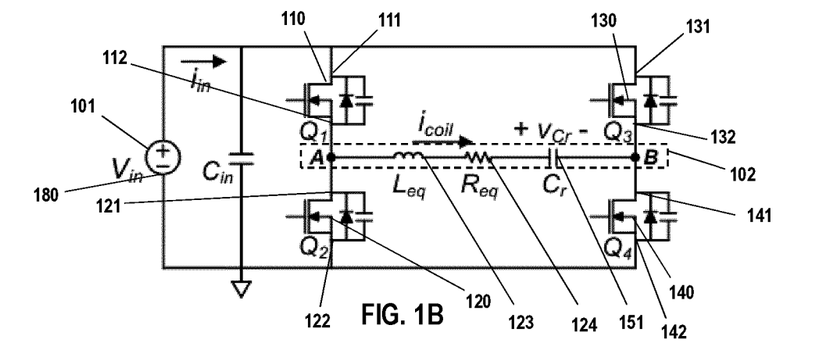

FIGS. 1A and 1B are schematic drawings of an induction cooking circuit 100 of an induction cooking system in accordance with an illustrative embodiment. Referring generally to FIGS. 1A and 1B, the induction cooking circuit 100 includes a power source 101 and a series resonant bridge inverter circuit 102 (i.e., inverter circuit 102). In some embodiments, the power source 101 may be a direct current (DC) bus. In some embodiments, the inverter circuit may be a half-bridge circuit with one set of switches. In other embodiments, the inverter circuit may be a full-bridge circuit with two or more sets of switches. In some embodiments, the induction cooking circuit 100 also includes a first switch (e.g., a first transistor 110), a second switch (e.g., a second transistor 120), a third switch (e.g., a third transistor 130), and a fourth switch (e.g., a fourth transistor 140). In an embodiment, the first, second, third, and fourth switches 110, 120, 130, and 140 are metal oxide semiconductor field effect transistors (MOSFETs). In alternative embodiments, other transistors may be implemented. In general, the first, second, third, and fourth switches may be any device that can be turned on and off by receiving a signal from a control circuit. In some embodiments, the switches may be n-type or p-type MOSFETs.

Referring generally to FIG. 1A, the inverter circuit 102 may include an induction coil 150, a resonant capacitor 151, and a current detector (not depicted). Referring generally now to FIG. 1B, the induction coil 150 (and corresponding pan) may be represented schematically as an inductor 123 and resistor 124 connected in series. In an embodiment, a first terminal 111 of the first transistor 110 is connected to a positive terminal of the power source 101 (e.g., a DC bus) and to a first terminal 131 of the third transistor 130. A second terminal 112 of the first transistor 110 is connected to a first input terminal 152 of the inverter circuit 102 and to a first terminal 121 of the second transistor 120. A second terminal 132 of the third transistor 130 is connected to a second input terminal 153 of the inverter circuit 102 and to a first terminal 141 of the fourth transistor 140. A second terminal 122 of the second transistor 120 is connected to a second terminal 142 of the fourth transistor 140 and to a negative terminal 180 of the power source 101. In an embodiment, the negative terminal 180 of the power source 101 is also connected to ground.

In some embodiments, a bypass capacitor 103 may also be in parallel with the power source 101. The power source 101 is a direct current (DC) voltage source. The DC voltage source may have ripple or modulation from a non-filtered rectified alternating current (AC) voltage source. The power source 101 has a voltage $V_{in}$ and supplies an input current $I_{in}$. The current detector (not depicted) senses a current $I_{coil}$ that is in the inverter circuit 102.

Figure 2:
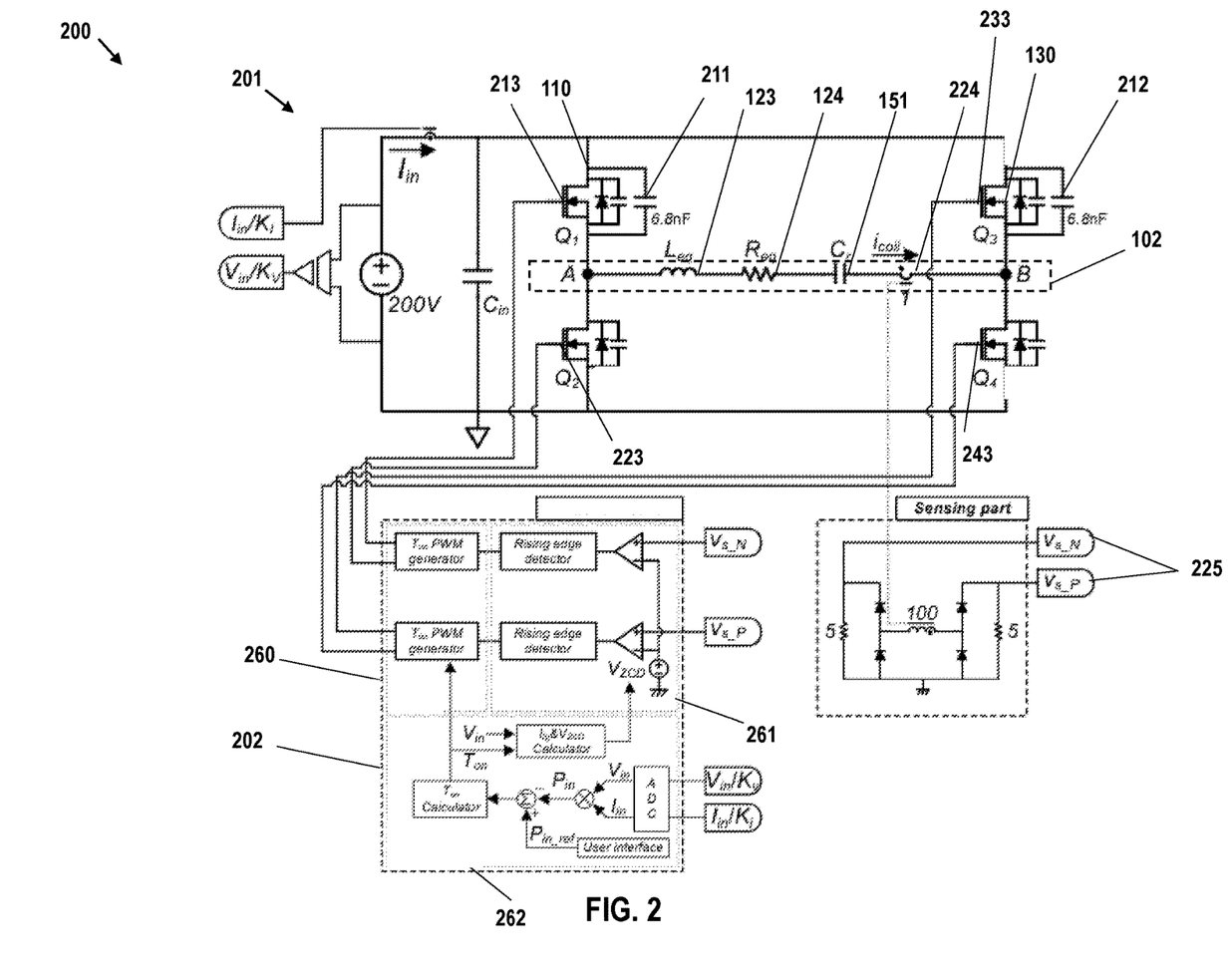
FIG. 2 is a schematic drawing of an induction cooking system in accordance with an illustrative embodiment.

FIG. 2 is a schematic drawing of an induction cooking system 200 in accordance with an illustrative embodiment. The induction cooking system 200 includes an induction cooking circuit 201 and a control circuit 202. In an embodiment, the control circuit 202 includes a microprocessor, and one or more functions of the control circuit 202 are implemented using instructions stored on a computer-readable storage medium (e.g., memory) that are executed by the microprocessor. In some embodiments, the control circuit 202 may be any computing device. In various embodiments, the control circuit 202 may be implemented using software, hardware (e.g., discrete components, integrated circuits, etc.), or any combination thereof. The induction circuit 201 is similar to the embodiment described in FIGS. 1A and 1B. In some embodiments, the induction cooking circuit 201 may include a first capacitor 211 connected in parallel to the first transistor 110. Additionally, the induction cooking circuit 201 may also include a second capacitor 212 connected in parallel to the third transistor 130. The first capacitor 211 and the second capacitor 212 may be implemented to reduce turn off current in the first and third transistors 110 and 130, respectively. That is, the first and third transistors 110 and 130 are connected to positive terminal of the power source 101 thus the first terminals 111 and 131 are always connected to the voltage $V_{in}$ and thus when the first and third transistors 110 and 130 are turned off (i.e., the gate voltage is removed) the body of the respective transistors 110 and 130 experience a high turn off current, the first and second capacitors 211 and 212 alleviate the power loss by supplying the extra current. In some embodiments, the first and second capacitors 211 and 212 may be selected to be 6.8 nano-farads (nF). In some embodiments, each of the first, second, third, and fourth transistors 110, 120, 130, and 140 may each have a respective capacitor connected in parallel. In some embodiments, each of the respective capacitors may be selected to be 3.3 nano-farads (nF).

The inverter circuit 102 of the induction cooking circuit 201 includes an induction coil (represented as an inductor $L_{eq}$ 123 and resistor $R_{eq}$ 124 in series), a resonant capacitor $C_r$ 151, and a current detector 224 wired in series. The current detector 224 is configured to detect the current $I_{coil}$ in the inverter circuit and to provide an output 225 based on the magnitude and direction of the detected current $I_{coil}$. The output 225 may then be output to the control circuit 202 to provide feedback to the control circuit 202 of the current $I_{coil}$ in the inverter circuit 102. That is, the output 225 of the current detector 224 is connected to the control circuit 202. Further, the control circuit 202 is also connected to a gate terminal 213, 223, 233, and 243 of each of the four transistors 110, 120, 130, and 140, respectively.

In this way, the feedback from the output 225 of the current detector 224 is fed into the control circuit 202 to influence the control circuits 202 application of gate voltages to each of the four transistors 110, 120, 130, and 140.

The control circuit 202 may include a pulse width modulator (PWM) 260, a comparator module 261, and a software control module 262. The software control module 262 may be connected to a user interface (not depicted) and receives a power setting $P_{in\_ref}$ reference. In some embodiments, the power setting $P_{in\_ref}$ reference may set by a signal or a parameter sent to the control circuit from an internal (e.g., the control circuit 202) or an external (e.g., a user or a second processor) device. The power setting $P_{in\_ref}$ is then used by the software control module 262 to calculate the amount of time $T_{on}$ that a voltage should be applied to the inverter circuit 102. In some embodiments, the power setting $P_{in\_ref}$ is a percentage of a maximum power $P_{in}$. The software module 262 also calculates a target current $I_{tg}$. The target current $I_{tg}$ is the current at which the control circuit 202 determines to turn on or off one or more of the transistors 110, 120, 130, and 140 in order to achieve zero current switching (ZCS) and zero voltage switching (ZVS) of the transistors 110, 120, 130, and 140. That is, $I_{tg}$ is calculated for each power setting and ensures that the induction cooking system 200 is transitioned at a time where the induction cooking circuit can facilitate ZVS and ZCS of the circuit components. In an embodiment, the target current $I_{tg}$ is used to calculate a bias voltage $V_{ZCD}$ for the comparator module 261. The exact calculation of the bias voltage $V_{ZCD}$ may change depending upon the exact values of the components used in the circuit and the operating conditions of the circuit. In some embodiments, operating conditions of the circuit may include power settings, the load impedance, and input voltage.

Figure 3A:
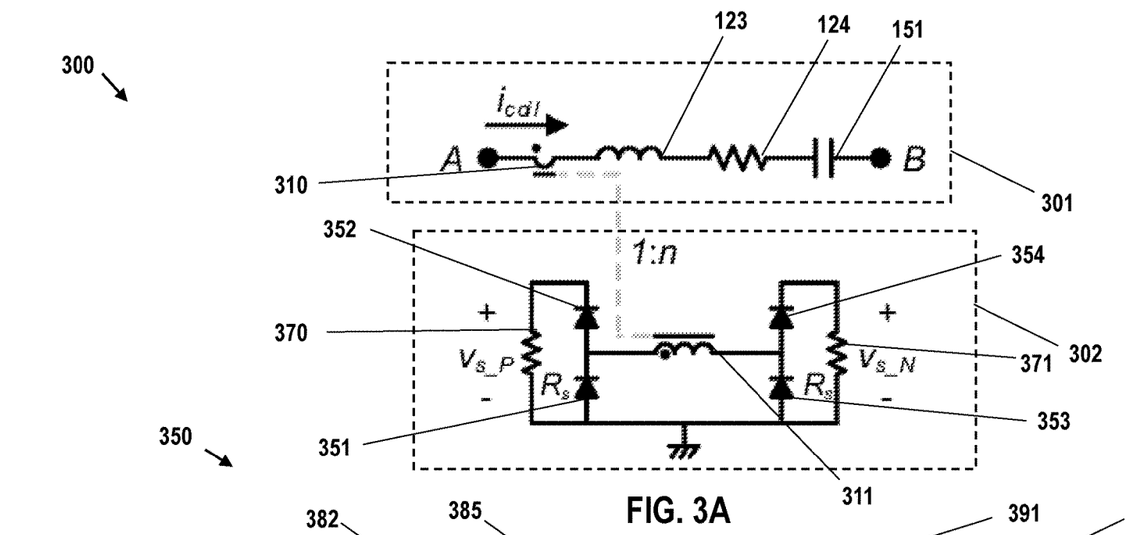
FIG. 3A is a schematic drawing of the induction coil circuit and current detector in accordance with an illustrative embodiment.
Figure 3B:
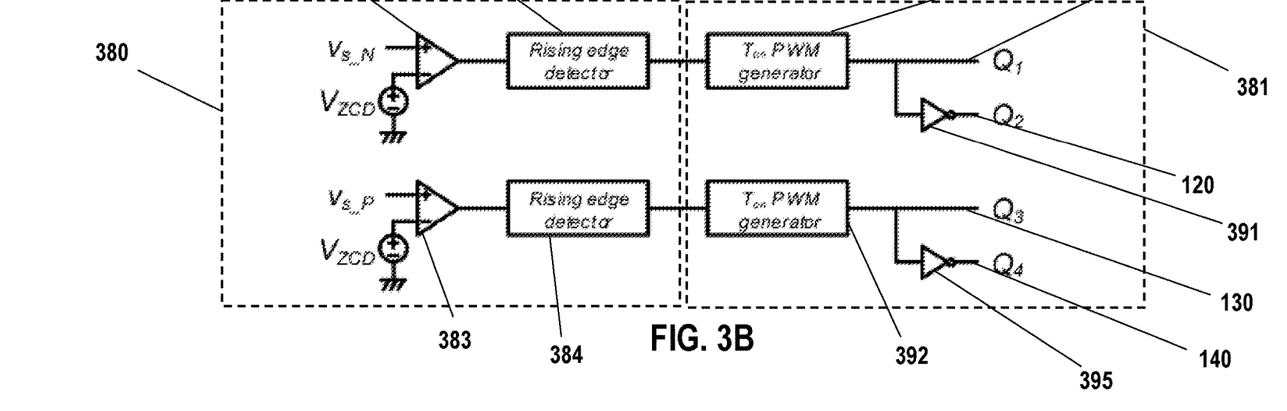
FIG. 3B is a schematic drawing of a comparator module and a pulse width modulator in accordance with an illustrative embodiment.
Figure 4:
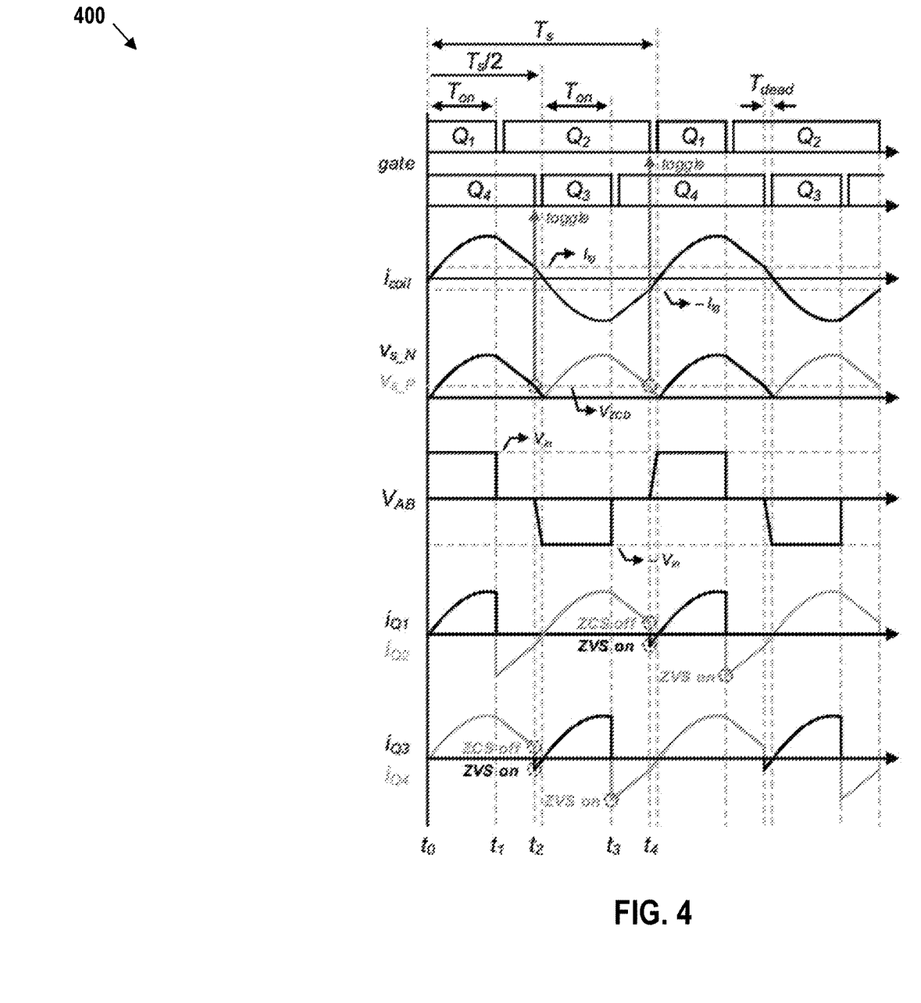
FIG. 4 is a waveform diagram of an induction cooking system in accordance with an illustrative embodiment.

In general, the comparator module 261 receives the output 225 of the current detector 224 and the calculated bias voltage $V_{ZCD}$ and compares the two. The comparator module generates an output to the PWM 260 based on the output 225 of the current detector 224 and the calculated bias voltage $V_{ZCD}$. The pulse width modulator (PWM) 260 receives the output from the comparator module 261 and the calculated amount of time $T_{on}$ from the software module 262 and provides a gate voltage to one or more of the four transistors 110, 120, 130, and 140. FIGS. 3A, 3B, and 4 are provided below for more details of the control circuit 202. In alternative embodiments, different methods of calculating, sensing, and/or switching may be implemented to facilitate application of gate voltages to each of the four transistors 110, 120, 130, and 140 and further the application of voltage to the inverter circuit 102 in order to achieve ZVS and ZCS of the induction cooking system 200.

FIG. 3A is a schematic drawing 300 of the induction coil circuit 301 and current detector 224 in accordance with an illustrative embodiment. FIG. 3B is a block diagram 350 of a comparator module and a pulse width modulator (PWM) in accordance with an illustrative embodiment. The schematic drawing 300 includes an inverter circuit (e.g., an RLC circuit) 301 and a current detector circuit 302. The inverter circuit 301 is similar to the inverter circuit 102 described above. The current detector circuit 302 senses the current $I_{coil}$ in the inverter circuit using first inductor 310 and second inductor 311. The first inductor 310 is connected in series with the inductor coil (inductor $L_{eq}$ 123 and resistor $R_{eq}$ 124 in series) and a resonant capacitor $C_r$ 151.

The second inductor 311 is placed in close proximity to the first inductor 310 such that a magnetic field generated by the current $I_{coil}$ in the first inductor 310 is sensed by the second inductor 311. The first inductor 310 and the second inductor 311 have a ratio of coils that are represented by a ratio of 1:n, respectively. One terminal of the second inductor 311 is connected to a cathode terminal of a first diode 351 and an anode terminal of a second diode 352. The other terminal of the second inductor 311 is connected to a cathode terminal of a third diode 353 and an anode terminal of a fourth diode 354. The anode terminal of the first diode 351 is connected with the cathode terminal of the second diode 352 with a first resistor 370 connected in series therebetween. The anode terminal of the third diode 353 is connected with the cathode terminal of the fourth diode 354 with a second resistor 371 connected in series therebetween. A first voltage $V_{s\_p}$ is the voltage over the first resistor 370 and a second voltage $V_{s\_n}$ is the voltage over the second resistor 371. The first resistor 370 and the second resistor 371 may have the same resistance value $R_s$. Thus, when the second inductor 311 begins to conduct current due to sensed current $I_{coil}$ in the inverter circuit 102 the first voltage $V_{s\_p}$ becomes non-zero when $I_{coil}$ is moving in a first (e.g., positive) direction and the second voltage $V_{s\_p}$ becomes non-zero when $I_{coil}$ is moving in a second (e.g., negative) direction. In particular, the relationship of the first voltage $V_{s\_p}$ and second voltage $V_{s\_n}$ is described by equation (1) below:

$$I_{coil} = \frac{n}{R_s}(V_{s\_p} - V_{s\_n}) \tag{1}$$

Further, when the current $I_{coil}$ is moving in the first (e.g., positive) direction the value of $V_{s\_p}$ is described by equation (2) and when the current $I_{coil}$ is moving in the second (e.g., negative) direction the value of $V_{s\_n}$ is described by equation (3).

$$V_{s\_p} = |I_{coil}| * \frac{R_s}{n}; \text{ and} \tag{2}$$
$$V_{s\_n} = 0$$

$$V_{s\_n} = |I_{coil}| * \frac{R_s}{n}; \text{ and} \tag{3}$$
$$V_{s\_p} = 0$$

The first voltage $V_{s\_p}$ and second voltage $V_{s\_n}$ are the outputs of the current detector circuit 302 and the inputs for the bock diagram 350 in FIG. 3B. In general, the block diagram 350 includes a comparator module 380 and a pulse width modulator (PWM) 390. The comparator module 380 includes a first comparator 382 and a second comparator 383. In alternative embodiments, other facilitations of comparing two or more inputs may be used. The comparator module 380 also includes a first rising edge detector 385 connected to the output of the first comparator 382 and a second rising edge detector 384 that is connected to the output of the second comparator 383. The first and second comparators have a first terminal (e.g., the negative terminal) connected to the bias voltage $V_{ZCD}$. A second (e.g., positive terminal) of the first comparator 382 may be connected to the second voltage $V_{s\_n}$ and a second terminal (e.g., positive terminal) of the second comparator 383 may be connected to the first voltage $V_{s\_p}$. In this way, when the current $I_{coil}$ is moving in the first (e.g., positive) direction with a large enough magnitude (e.g., such that $V_{s\_p}$ becomes greater than the bias voltage $V_{ZCD}$), the second comparator 383 outputs a rising edge and is detected by the second rising edge detector 384. Further, when the current $I_{coil}$ is moving in the second (e.g., negative) direction with a large enough magnitude (e.g., such that $V_{s\_n}$ becomes greater than the bias voltage $V_{ZCD}$), the first comparator 382 outputs a rising edge and is detected by the first rising edge detector 385.

The first rising edge detector 385 is connected to a first pulse width modulator generator 391 of the PWM 381. The second rising edge detector 384 is connected to a second pulse width modulator generator 392 of the PWM 381. The output of the first pulse width modulator generator 391 is connected directly to the gate of the first transistor 110 and connected to the gate of the second transistor 120 through NOT gate 394. The output of the second pulse width modulator generator 391 is connected directly to the gate of the third transistor 130 and connected to the gate of the fourth transistor 140 through NOT gate 395. In this way, the first pulse width modulator generator 391 receives the output from the first rising edge detector 383 and generates an output to the respective transistors for a set period of time (e.g., $T_{on}$) and then returns an initial state. Further, the second pulse width modulator generator 392 receives the output from the second rising edge detector 384 and generates an output for a set period of time (e.g., $T_{on}$) and then returns an initial state. In some embodiments, the PWM 381 may also include logic to implement a time period $T_{dead}$ to delay the switching time between states in order to prevent shoot-through and allow for zero voltage and zero current switching of the switches (e.g., transistors).

FIG. 4 is a waveform diagram 400 of an induction cooking system accordance with an illustrative embodiment. Referring to FIG. 4, reference will be made back to various embodiments included in FIGS. 1, 2, and 3. In particular, the waveform diagram 400 depicts two periods of the induction cookware system. A period $T_s$ is the period of the frequency of the inverter circuit that is unique to a power setting. At a first time $t_0$, a voltage is applied to the gate of first transistor 110 (e.g., $Q_1$) and the gate of the fourth transistor 140 (e.g., to turn the switching on). At a second time $t_1$, a voltage is removed from the gate of the first transistor 110 (e.g., to turn the first switch off). The time between the first time $t_0$ and the second time $t_1$ is the calculated time $T_{on}$ and is the time that the power source voltage $V_{in}$ is effectively applied between the first input terminal 152 of the inverter circuit 102 and the second input terminal 153 of the inverter circuit 102, which is represented by the voltage $V_{AB}$. The calculated time $T_{on}$ is the calculated time based on the power setting. That is, the calculated time $T_{on}$ is the period of time that the first transistor 110 is active and controls a duty cycle of time that voltage $V_{AB}$ is being applied. The duty cycle is the ratio of the calculated time $T_{on}$ to the switching cycle period. As an example, if the induction cooking circuit is being operated at full power, the calculated time $T_{on}$ for the first transistor 110 would be calculated to be on half of the period of the resonant frequency (e.g., a maximum) of the RLC (e.g., induction) circuit and the duty cycle is near fifty percent. Alternatively, if the induction cooking circuit is being operated at a low power setting, then the calculated time $T_{on}$ is smaller and the duty cycle is much smaller than 50 percent. In some embodiments, the highest power operating point and lowest switching frequency will be slightly higher than the resonant frequency. As all four switches turn off at a non-zero current, resonant frequency may not be exactly reached for the switching frequency. Further, during the time between the first time $t_0$ and the second time $t_1$, the voltage $V_{AB}$ causes the current $I_{coil}$ in the inverter circuit 102 to rise in the first direction (e.g., positive direction) in a manner that is consistent with a RLC circuit. A current $I_{Q1}$ in the first transistor 110 and a current $I_{Q4}$ in the fourth transistor 140 also rise during the time period between the first time $t_0$ and the second time $t_1$.

After a time period $T_{dead}$ after the second time $t_1$, a voltage is applied to the gate of the second transistor 120 (e.g., $Q_2$). The time period $T_{dead}$ is a transition time that is built into the control system to delay between switching to avoid shoot-through and allow for soft turn-on (e.g., allow for zero voltage switching) of the switches. Moreover, at the second time $t_1$ the magnitude and direction of current $I_{coil}$ is such that the second transistor 120 is turned on with zero voltage switching (ZVS) and thereby reduces inefficiencies in the induction cooking system. After the second time $t_1$, the current $I_{coil}$ in the inverter circuit 102 begins to decrease in a manner that is consistent with an RLC circuit current.

At a third time $t_2$, a voltage is removed from the gate of the fourth transistor 140 (e.g., $Q_4$). That is, at the third time $t_2$, the second voltage $V_{s\_n}$ becomes less than the bias voltage $V_{ZCD}$ and causes the voltage on the gate of the fourth transistor 140 to be removed (e.g., turn off the fourth transistor 140). The bias voltage $V_{ZCD}$ is dynamically calculated based on an estimated transition current $I_{tg}$ that allows for the transitions of the transistors to have energy marginally higher than the energy needed for zero voltage switching energy. After the time period $T_{dead}$ after the third time $t_2$, the voltage is applied to the gate of the third transistor 130 (e.g., $Q_3$) and the third transistor 130 is considered on. Further, at the third time $t_2$, a current $I_{Q4}$ through the fourth transistor is near zero when the voltage is removed from the gate of the fourth transistor 140, thus resulting in zero current switching (ZCS) and reducing the amount of power loss. Moreover, at the third time $t_2$ the voltage applied to the gate of the third transistor 130 is done when the current $I_{coil}$ still has a small magnitude (e.g., $I_{tg}$) an allows for the third transistor 130 to transition with zero voltage zero current switching (ZVZCS) conditions and thereby increases the efficiency of the system.

After the time period $T_{dead}$ after the third time $t_2$, the power source voltage $V_{in}$ is effectively applied between the second input terminal 153 of the inverter circuit 102 and the first input terminal 152 of the inverter circuit 102. That is, the polarity of the power source voltage $V_{in}$ as applied relative to the inverter circuit 102 is switched relative to the voltage $V_{AB}$ at the first time $t_0$.

At a fourth time $t_3$, a voltage is removed from the gate of the third transistor 130 and a voltage is applied to the gate of the fourth transistor 140. The time between the fourth time $t_3$ and the third time $t_2$ is the calculated time $T_{on}$. After a time period $T_{dead}$ after the fourth time $t_3$, a voltage is applied to the gate of the fourth transistor 140 (e.g., the fourth switch is turned on). Moreover, at fourth time $t_3$, the magnitude and direction of current $I_{coil}$ is such that the fourth transistor 140 is turned on with zero voltage switching (ZVS) and thereby reduces inefficiencies in the induction cooking system.

At a fifth time $t_4$, the first voltage $V_{s\_n}$ becomes less than the bias voltage $V_{ZCD}$ and in response a voltage is removed from the gate of the second transistor 120 (i.e., the second switch is off). After a time period $T_{dead}$ after the fifth time $t_4$, and the voltage is applied to the gate of the first transistor 110 (e.g., the first switch is on). Additionally, at the fifth time $t_4$, a current $I_{Q2}$ through the second transistor 120 is near zero, thus the second transistor 120 is turned off (e.g., a channel through the body dissipates) in near zero current switching (ZCS) conditions and results in a more efficient transition. Moreover, at the fifth time $t_4$, the magnitude and direction of the current $I_{coil}$ (e.g., current going into the second terminal of the first transistor 110) allows for zero voltage switching (ZVS) (e.g., turn-on) of the first transistor 110, and thus reduces power losses of the system. After a time period $T_{dead}$ after the fifth time $t_4$, the process repeats. In an alternative mode, where the power setting from the user is a full power operation of the circuit, $T_{on}$ is substantially equal to half of the resonant period of the inverter circuit. That is, in a full power setting, the time that $V_{in}$ is applied to the inverter circuit is half of the calculated period of the RLC circuit, and the polarity of $V_{in}$ is switched (via the facilitations described above) for the other half of the calculated period of the period of the RLC circuit.

The period of time that the first and third switches are activated may be the calculated time that relates to the power setting. The period of time may be calculated based on the power setting. A ratio of the period of time to the switching period may be the duty cycle of the output voltage. In some embodiments, the period of time also affects the switching frequency of the induction cooking circuit. For example, the smaller duration of the period of time increases the switching frequency and the longer duration of the period of time decreases the switching frequency. The lowest switching frequency may be the resonant frequency of the induction cooking circuit that is achieved when the time period is equal to one half of the period of the resonant frequency of the induction cooking circuit. In some embodiments, when the induction circuit is being operated at full power, the duty cycle is near fifty-fifty, the switching frequency is the resonant frequency, and the period of time that the first transistor is active is about equal to one half of the period of the resonant frequency of the induction cooking circuit, the period of time that the third transistor is active is about equal to one half of the period of the resonant frequency, and the total time period that a voltage of each polarity is applied to the resonant circuit is equal to about half of the period of the resonant frequency.

In some embodiments, the comparator module 380 may only have one comparator 382. For example, in a half bridge embodiment of the induction cooking system 100, where the third and fourth transistors (e.g., switches) 130 and 140 (or, in some embodiments, first and second transistors 110 and 120) are omitted. The comparator module 380 may only need one comparator 382 (or 383) to monitor the series resonant circuit. In another example, where none of the transistors are omitted, the comparator module 380 may also only have one comparator 382. For example, the one comparator 382 may be used to monitor the current in the $I_{coil}$ during one half cycle (e.g., the first half cycle $t_0$-$t_2$) to determine the approximate switching times. The control circuit 202 may then mirror the timing on the second half of the cycle in order to control the other switches (e.g., the third and fourth transistors 130 and 140.) In other words, in one example embodiment, the one comparator 382 monitors $I_{coil}$ via monitoring output of $V_{s\_n}$. At $t_0$ the first and fourth transistors are activated. After calculated time $T_{on}$ (e.g., calculated by the control circuit 202) the first transistor 110 is deactivated (i.e., at $t_1$). The one comparator 382 senses when $V_{s\_n}$ drops below the bias voltage $V_{ZCD}$ at $t_2$. The time period $T_{dead}$ may be known or estimated based on the transistors used. The control circuit 202 then may save, store or otherwise reference the amount of time between $t_1$ and $t_2$ and mirror the time for the second half of the cycle (e.g., the control circuit 202 may assume the time between $t_4$ and $t_3$ is equal to the time between $t_1$ and $t_2$) instead of monitoring $I_{coil}$ via monitoring output of $V_{s\_p}$. It is to be appreciated that other elements may be eliminated depending upon the application, configuration, and/or implementations.

Figure 5:
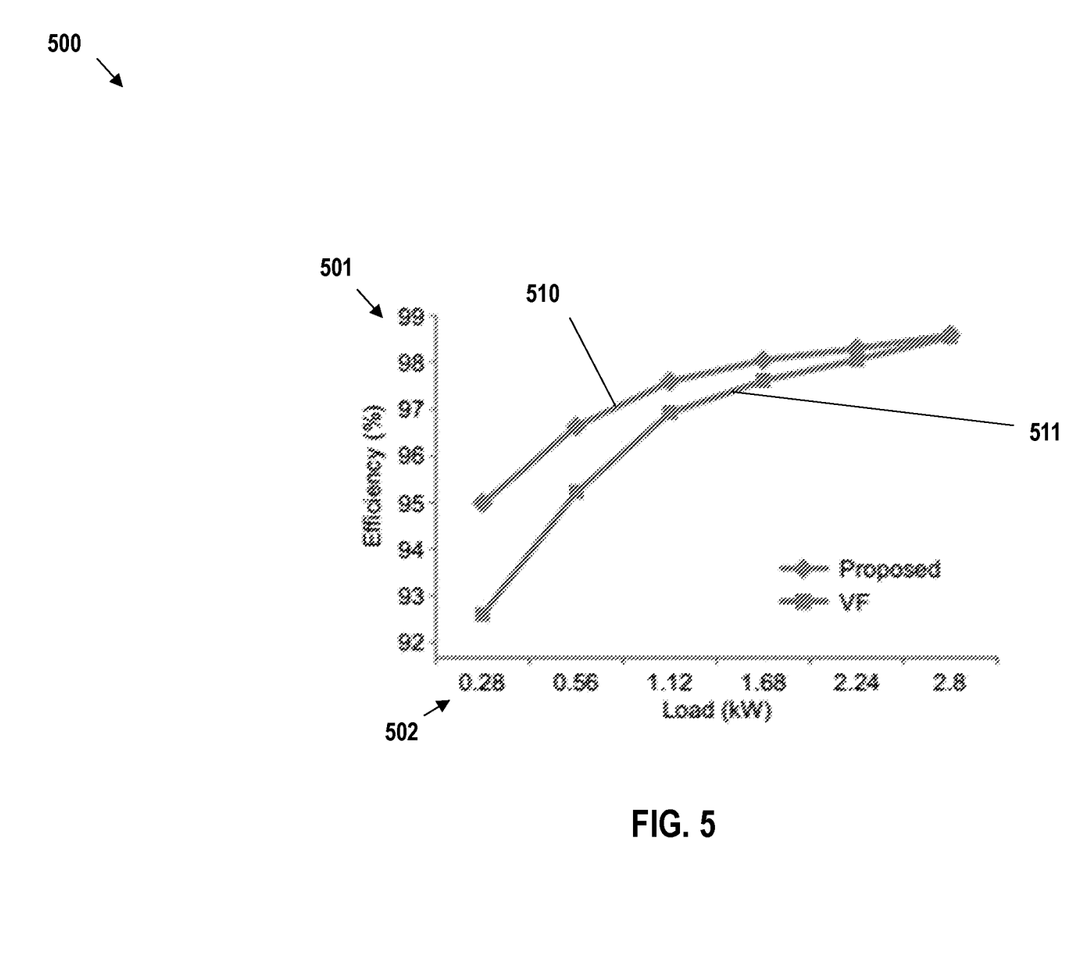
FIG. 5 is efficiency graph of an induction cooking system in accordance with an illustrative embodiment.

FIG. 5 depicts an efficiency graph 500 of an embodiment of the induction cooking system in accordance with an illustrative embodiment. A y-axis 501 indicates the efficiency level and an x-axis 502 indicates the load (e.g., the power input from the user). A first line 510 of the graph indicates the efficiency level of an embodiment of the induction cooking system that is similar to those described in FIGS. 1-4. A second line 511 of the graph indicates the measured efficiency of other induction cooking systems in the art. From the efficiency graph, the improved efficiency of the disclosed induction cooking system is readily apparent over alternative systems.

It is to be appreciated that alternative embodiments are contemplated. For example, in alternative embodiments, alternative methods may be used to sense the current in the inverter circuit and alternative controls may be implemented to facilitate the turning on and off of transistors (e.g., apply a voltage to the inverter circuit) at optimal times to reduce inefficiencies. For example, a software module may be implemented to sense the current $I_{coil}$ in the inverter circuit and compare the magnitude of the current $I_{coil}$ sensed by the current detector to compare to a determined transition current $I_{tg}$.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A circuit for inductively heating cookware, the circuit comprising:
    a series resonant inverter circuit comprising a plurality of switches and one or more induction coils structured to inductively couple to the cookware to heat the cookware, the inverter circuit comprising a current sensor configured to sense a coil current signal across the one or more induction coils and generate a first sensed voltage signal corresponding to one of a positive portion or a negative portion of the coil current signal and a second sensed voltage signal corresponding to the other of the positive portion or the negative portion of the coil current signal; and
    a control circuit configured to control switching of a first set of one or more of the plurality of switches based on the first sensed voltage signal and a second set of one or more of the plurality of switches based on the second sensed voltage signal, wherein the control circuit comprises:
    a comparator module configured to compare the first sensed voltage signal and the second sensed voltage signal to a calculated bias voltage and provide a comparator output, the calculated bias voltage calculated based on a target current wherein the target current is the current at which the control circuit turns off or turns on one or more of the plurality of switches to implement zero current switching and/or zero voltage switching; and
    a pulse width modulation module configured to implement the zero current switching and/or zero voltage switching using the comparator output by providing a control signal to the plurality of switches based on the comparator output.

2. The circuit of claim 1, wherein the control circuit is configured to:
    compare a magnitude of the first sensed voltage signal to the calculated bias voltage and control switching of the first set of switches responsive to determining that the magnitude of the first sensed voltage signal is equal to the calculated bias voltage; and
    compare a magnitude of the second sensed voltage signal to the calculated bias voltage and control switching of a second set of switches responsive to determining that the magnitude of the second sensed voltage signal is equal to the calculated bias voltage.

3. The circuit of claim 2, the control circuit comprising:
    a first comparator configured to compare the magnitude of the first sensed voltage signal to the calculated bias voltage and generate a first output responsive to determining the magnitude of the first sensed voltage signal is equal to the calculated bias voltage; and
    a second comparator configured to compare the magnitude of the second sensed voltage signal to the calculated bias voltage and generate a second output responsive to determining the magnitude of the second sensed voltage signal is equal to the calculated bias voltage.

4. The circuit of claim 3, wherein the first comparator is configured to generate the first output to have a rising edge responsive to determining the magnitude of the first sensed voltage signal is equal to the calculated bias voltage and the second comparator is configured to generate the second output to have a rising edge responsive to determining the magnitude of the second sensed voltage signal is equal to the calculated bias voltage, the control circuit further comprising:
    a first rising edge detector configured to detect the rising edge of the first output of the first comparator, the control circuit configured to control switching of the first set of switches based on an output of the first rising edge detector; and
    a second rising edge detector configured to detect the rising edge of the second output of the second comparator, the control circuit configured to control switching of the second set of switches based on an output of the second rising edge detector.

5. The circuit of claim 4, the control circuit further comprising:
    a first control signal generator configured to generate a first set of one or more control signals configured to control the switching of the first set of switches based on the output of the first rising edge detector; and
    a second control signal generator configured to generate a second set of one or more control signals configured to control the switching of the second set of switches based on the output of the second rising edge detector;
    wherein the control circuit is configured to transmit the first set of control signals to the first set of switches and the second set of control signals to the second set of switches.

6. The circuit of claim 5, wherein the first set of control signals and the second set of control signals are pulse width modulation (PWM) signals.

7. The circuit of claim 2, the control circuit configured to calculate the calculated bias voltage such that the control circuit causes activation of one or more switches of the plurality of switches at a time when magnitudes of the coil current signal, the first sensed voltage signal, and the second sensed voltage signal are zero.

8. The circuit of claim 1, the inverter circuit further comprising a capacitor connected in series with the one or more induction coils, wherein the first set of switches is coupled to the one or more induction coils and the second set of switches is coupled to the capacitor.

9. A circuit for inductively heating cookware, the circuit comprising:
   a series resonant inverter circuit comprising a plurality of switches and one or more induction coils structured to inductively couple to the cookware to heat the cookware, the inverter circuit comprising a voltage sensor configured to sense a voltage across at least one of the plurality of switches; and
   a control circuit configured to control switching of a first set of one or more of the plurality of switches based on the voltage sensed across the at least one of the plurality of switches, wherein the control circuit comprises:
   a comparator module configured to compare a first sensed voltage signal and a second sensed voltage signal to a calculated bias voltage and provide a comparator output, the calculated bias voltage calculated based on a target current, wherein the target current is the current at which the control circuit turns off or turns on one or more of the plurality of switches to implement zero current switching and/or zero voltage switching; and
   a pulse width modulation module configured to implement the zero current switching a nd/or zero voltage switching using the comparator output by providing a control signal to the plurality of switches based on the comparator output.

10. The circuit of claim 9 wherein the control circuit is configured to compare a magnitude of the voltage sensed to the calculated bias voltage and control switching of a set of the plurality of switches.

11. The circuit of claim 10, wherein the threshold voltage calculated bias voltage is zero.

* * * * *

UNITED STATES PATENT AND TRADEMARK OFFICE
CERTIFICATE OF CORRECTION

| | |
|---|---|
| PATENT NO. | : 11,968,765 B2 |
| APPLICATION NO. | : 16/657472 |
| DATED | : April 23, 2024 |
| INVENTOR(S) | : Jeremiah Kopiness et al. |

It is certified that error appears in the above-identified patent and that said Letters Patent is hereby corrected as shown below:

In the Claims

Column 16, Claim 9, Line 11, "a nd/or zero voltage" should read -- and/or zero voltage --.

Signed and Sealed this
Twenty-first Day of May, 2024

*Katherine Kelly Vidal*

Katherine Kelly Vidal
*Director of the United States Patent and Trademark Office*